United States Patent
Gisler et al.

(10) Patent No.: US 9,482,729 B2
(45) Date of Patent: Nov. 1, 2016

(54) NMR MEASURING CONFIGURATION WITH TEMPERATURE CONTROL DEVICE FOR A SAMPLE VIAL

(71) Applicant: Bruker BioSpin AG, Faellanden (CH)

(72) Inventors: Philipp Gisler, Zurich (CH); Dirk Wilhelm, Maur (CH); Christoph Pfenninger, Rafz (CH)

(73) Assignee: Bruker BioSpin AG, CH-Faellanden (CH)

( * ) Notice: Subject to any disclaimer, the term of this patent is extended or adjusted under 35 U.S.C. 154(b) by 524 days.

(21) Appl. No.: 14/025,844

(22) Filed: Sep. 13, 2013

(65) Prior Publication Data

US 2014/0084928 A1     Mar. 27, 2014

(30) Foreign Application Priority Data

Sep. 27, 2012   (DE) .................... 10 2012 217 601

(51) Int. Cl.
*G01V 3/00*   (2006.01)
*G01R 33/31*  (2006.01)

(52) U.S. Cl.
CPC ..................... *G01R 33/31* (2013.01)

(58) Field of Classification Search
CPC ....................................... G01R 33/31
See application file for complete search history.

(56) References Cited

U.S. PATENT DOCUMENTS

| 3,170,328 A * | 2/1965 | Werner ................. G01K 13/02 338/28 |
| 4,266,194 A | 5/1981 | Hlavka |
| 5,192,910 A | 3/1993 | Hepp |
| 5,408,181 A | 4/1995 | Dechene |
| 2001/0013779 A1 | 8/2001 | Marek |
| 2001/0015646 A1 | 8/2001 | Marek |
| 2003/0206020 A1 | 11/2003 | Cohen et al. |
| 2011/0284192 A1 | 11/2011 | Grossniklaus |
| 2012/0119738 A1 | 5/2012 | Hiller |

FOREIGN PATENT DOCUMENTS

| DE | 4 017 079 | 5/1991 |
| JP | 5899655 | 6/1983 |
| JP | 05215829 | 9/1993 |

OTHER PUBLICATIONS

Balachandran P., Gas Dynamics for Engineers, PHI Learning Pvt. Ltd., p. 265, 2010.*

* cited by examiner

*Primary Examiner* — Daniel Miller
(74) *Attorney, Agent, or Firm* — Paul Vincent

(57) ABSTRACT

An NMR measuring configuration has a temperature control device for a sample vial (1). The temperature control device has a temperature sensor with supply wires which are both surrounded by a sensor tube (15). The sensor tube (15) is connected to a measurement space via a sensor flow inlet (26) in such a way that a partial flow of a temperature-control fluid flows as a temperature-control flow (16) into a free space (17) between the temperature sensor and the inner wall of the sensor tube along the supply wires and flows out of the sensor tube via a sensor flow outlet (18) at the opposite end of the sensor tube. This minimizes both the temperature penetration factor and the difference between the sensor and sample temperatures ($\Delta Tp$).

21 Claims, 7 Drawing Sheets

NMR MEASURING CONFIGURATION WITH TEMPERATURE CONTROL DEVICE FOR A SAMPLE VIAL

This application claims Paris convention priority of DE 10 2012 217 601.2 filed on Sep. 27, 2012, the entire disclosure of which is hereby incorporated by reference.

BACKGROUND OF THE INVENTION

The invention relates to an NMR measuring configuration with a temperature control device for an NMR sample vial filled with a solid and/or liquid sample substance, which is disposed at a measuring position in an NMR spectrometer in a measurement space surrounded by NMR coils and around which temperature-control fluid flows, which is temperature controlled in the supply flow to the measurement space by a closed-loop-controlled heater, wherein at least one temperature sensor is provided whose temperature-sensitive measurement head is positioned in the spatial vicinity of the NMR sample vial and at least partially projects into the measurement space, while the supply wires to the measuring head of the temperature sensor are disposed in a space that is separate from the measurement space.

Such an NMR measuring configuration is known from U.S. Pat. No. 4,266,194 (=reference [1]).

Nuclear magnetic resonance (NMR) spectroscopy is a powerful method of instrumental analytics. In NMR spectroscopy, radio-frequency (RF) pulses are irradiated into a measurement sample that is disposed in a strong, static magnetic field, and the RF response of the measurement sample is measured. The information is gained integrally over a certain region of the measurement sample, termed the active volume. The measurement sample is measured by the probe head.

The temperature of the sample (Tprobe) influences the results of the NMR measurements. For high-quality measurements, the temperature is typically set using a temperature-control unit and, if possible, kept constant in space and time over the active measurement volume. NMR measurements are typically performed both with heated and with cooled samples. (If the sample is to be cooled to below room temperature, a sufficiently cold temperature-control fluid flow is guided in the supply flow tube and is heated to the target temperature by the heater.) The spatial temperature gradient over the active measurement volume and the stability of the sample temperature over time have a considerable influence on the quality of the NMR measurements.

Temperature-control units for minimization of the temperature gradient in the active measurement volume are known from DE 10 2010 029 080 A1 [2] and DE 40 18 734 C2 [3].

The temperature of the temperature-control fluid is measured using one or more temperature sensors. These sensor temperatures (Tsensor) are processed in a closed-loop control. This closed-loop control controls the heating power of the heater, which is located in the supply flow tube of the temperature-control fluid.

The aim of the closed-loop control is to set the desired target temperature in the NMR sample as well as possible. In prior art ([1], [3]), the temperature sensors are located outside the sample vial. The temperature sensors do not therefore measure the temperature of the sample but the temperature of the gas flowing around it. The difference between the sample temperature and the sensor temperature ($\Delta Tp$) is compensated for by suitable calibration (where $\Delta Tp = Tprobe - Tsensor$).

The calibration is, however, not equally valid for the entire temperature range of the sample, which is typically −200° C. to +200° C. Minimization of the deviation $\Delta Tp$ over the whole temperature range is therefore desirable.

Different types of temperature sensors are known. Thermocouples are in widespread use. These essentially comprise two supply wires of different materials (e.g. type K made of nickel-chromium and nickel-aluminum or type T made of copper and constantan), which are connected at a thermojunction. The thermojunction is positioned in a location at which the temperature is to be measured, the temperature measuring point. The wires and the thermojunction are typically surrounded by an electrically insulating filling material having good thermal conduction properties and surrounded by an electrically conductive sheath. The electrically conductive sheath counteracts the penetration of RF fields of the NMR coil into the interior of the temperature sensor and prevents the thermojunction from being directly heated by the influence of the RF fields and the RF currents from being able to advance further along the supply wires as far as the evaluation electronics of the temperature sensor as conducted interference. A further function of the electrically conductive sheath is to prevent the penetration of RF interference originating from, for example, radio and television transmitters and other unspecified sources of interference into the measuring head as well as possible by connecting the sheath, if possible over its entire length, to the ground of the measuring head, with a low-impedance connection to the outer enclosure of the measuring head being of decisive importance. The electrically conductive sheath typically exhibits high thermal conductivity.

The supply wires and the sheath exhibit longitudinal thermal conduction, which depends on the material and geometry. Longitudinal thermal conduction means thermal conduction that is perpendicular to the conductor cross-section. Transverse thermal conduction in the radial direction also occurs. The temperature sensor projects into the measurement space with an immersion depth ET and the temperature-control fluid surrounds or flows around it. Because of the longitudinal and transverse thermal conduction and the finite ET, the temperature sensor measures a mixed temperature comprising the temperature of the fluid flowing around the sensor tip and the temperature prevailing along the supply wires, especially outside the measurement space. The deviation of the mixed temperature from the temperature of the fluid in the absence of the sensor is unwanted and should be kept as small as possible. When the outside temperature changes, this causes the mixed temperature measured by the sensor to also change. This change is included in the control loop of the temperature control and causes a change in the Tin of the fluid flowing into the measurement space and ultimately in the sample temperature Tprobe. The ratio of the changes is termed the temperature penetration factor D of the laboratory temperature to the sample temperature:

$$D = \Delta Tprobe / (\Delta Tprobe + \Delta Tlab)$$

Where:
$\Delta Tprobe$=temperature change in the measurement sample
$\Delta Tlab$=change in the laboratory temperature.

One disadvantage of prior art, however, is that typical values for the temperature penetration factor are $D = 1/10 \ldots 1/20$.

The temperature penetration factor D has a direct influence on the quality of the NMR measurements because on a change in the laboratory temperature $\Delta Tlab$ changes the sample temperature by the factor $D \cdot \Delta Tlab$ ($\Delta$Tlab>>$\Delta$Tprobe was assumed). For that reason, an attempt is made to keep D as small as possible.

One way of minimizing the temperature penetration factor is to route the temperature sensor including its supply wires in the supply flow tube (cf. prior art in [1], [6]). However, because the supply flow tube is typically very well thermally insulated toward the exterior, e.g. by means of a glass vacuum vessel ([1]), it has large dimensions and the temperature sensor is therefore far away from the sample. This, in turn, results in a large difference between sample temperature (Tprobe) and sensor temperature (Tsensor).

Another way of minimizing D is to mount the temperature sensors in the measurement space. This possibility is applied in [1]. Because these temperature sensors are typically not completely non-magnetic, they must be kept at a certain distance from the sample vial to avoid magnetic interference. However, the greater the distance, the greater the difference between the sensor temperature and the sample temperature. Moreover, the parts of the supply wires not routed in the measurement volume cause a mixed temperature that deviates from the temperature of the temperature measuring point and therefore increases the temperature penetration factor D.

A further way of minimizing D is to minimize the longitudinal thermal conduction of the sensor from the connection to the thermojunction and to maximize it in the region of the thermojunction as far as the medium, while shielding against irradiated interference, as shown in [5]. The drawback of this method is the relatively complex structure of the sensor. Moreover, minimization of the longitudinal thermal conduction also entails minimization of the thermally relevant cross-sections and use of materials with poorer thermal conductivity, wherein not only RF shielding but also the filler material and the two supply wires must be considered. Depending on further requirements such as technical temperature range, tolerance, and resistance to aging of the sensor, it is not always possible to find an optimum solution because the requirements are sometimes mutually incompatible, in which case it is necessary to assess the advantages and disadvantages of different variants.

The object of this invention is to improve an NMR measuring configuration of the type mentioned in the introduction by the simplest possible technical means such that the temperature penetration factor is minimal and the difference between the sensor and sample temperature ($\Delta$Tp) is also minimized.

SUMMARY OF THE INVENTION

A large temperature penetration factor has the disadvantage that the sensor temperature is heavily influenced by the outside temperature. This has a negative influence on closed-loop control of the temperature and ultimately causes the sample temperature to change due to changes in outside temperature. Because NMR methods are sensitive to extremely small temperature changes in the range of 10 mK, it is extremely important for stable measurements that temperature penetration factors of the order of 1/100 are achieved for a change in laboratory temperature Tlab of 1° C.

A large temperature difference between the sensor and sample temperature has the disadvantage that the absolute temperature of the sample cannot be simply set. It is possible to perform calibration by which the sample temperature can be calculated from the sensor temperature. This calibration is, however, not identical over the entire temperature range of the sample, which is usually between −200° C. and +200° C., meaning that locally valid calibration has to be performed in each case. The object of the invention is to eliminate the need for local calibration by minimizing ($\Delta$Tp).

The object is achieved in a both surprisingly simple and effective manner by an NMR measuring device of the type mentioned in the introduction, which is characterized in that the temperature sensor and its supply wires are surrounded at a radial distance by a sensor tube, the latter being connected to the measurement space via a sensor flow inlet in such a way that a partial flow of the temperature-control fluid flows as the temperature-control flow out of the measurement space into the free space between the temperature sensor and the inner wall of the sensor tube along the supply wires of the temperature sensor and flows out of the sensor tube via a sensor flow outlet at the end of the sensor tube opposite the sensor flow inlet.

The temperature-control fluid is generally a gas, such as air, nitrogen, a nitrogen-oxygen mixture, or helium. Hereinafter we refer to a temperature-control gas for the sake of simplification without restriction of the generality although temperature controls are also possible with liquids or liquefied gases, such as liquid nitrogen.

The inventive NMR measuring configuration works on the principle that the exiting flow of the temperature-control gas is split. The larger part flows, as in the prior art, along the sample and heats or cools the latter. A second, smaller part flows into the sensor tube along the temperature sensor and ultimately out of an outlet at the end of the sensor tube. As it does so, the temperature-control gas flow cools down in the direction of flow due to thermal contact with the sensor tube because the sensor tube takes on the temperature in the probe head on the outer side and heat flows from the outside of the sensor tube to the inward flow of temperature-control gas. Because the measuring head of the temperature sensor is located at the entrance of the sensor tube, the temperature influence of this part of the temperature-control gas flow decreases with the distance from the measuring head. The temperature-control gas flow in the sensor tube ($\dot{V}$out2) counteracts the longitudinal thermal conduction in the supply wire. It acts to insulate the temperature sensor, including its supply wires, from the outside temperature. This considerably reduces the temperature penetration factor.

The invention is advantageous compared to prior art, since a small diameter can be chosen for the sensor tube because of the insulating effect of the gas flow. This makes it possible to place the temperature measuring point near to the sample vial, which, in turn, results in a small difference ($\Delta$Tp) between Tprobe and Tsensor. At the same time, a clearly reduced temperature penetration factor is achieved.

In a preferred temperature device for an NMR measuring configuration of the inventive type, the heater is disposed in the supply flow of the temperature-control fluid to the measurement space upstream of a flow inlet to the measurement space, preferably in a supply tube. In this embodiment, the heating power can be set based on the sensor temperature by means of a closed-loop control. If a sample temperature is to be reached that is below the laboratory temperature, a temperature-control fluid that has been cooled to clearly below room temperature is guided into the supply flow tube and heated by the heater.

In an advantageous variant of this embodiment, the measurement space is enclosed between an insert lower part and an insert upper part, spaced from the insert lower part in the axial direction of the NMR sample vial by a holder, and the flow inlet for the supply flow of the temperature-control fluid into the measurement space is provided in the insert lower part and a flow outlet for outflow of temperature-control fluid out of the measurement space is provided in the insert upper part. This has the advantage that the sample vial is in direct thermal contact with the temperature-control fluid. This enables fast heating or cooling to the desired target temperature.

In an especially preferred embodiment of the inventive temperature control device, the temperature-sensitive measuring head of the temperature sensor projects into the measurement space by an immersion depth ET≤20 mm. This ensures that the temperature-sensitive measuring head is directly located in the temperature-control fluid flow and the sensor temperature differs only very slightly from the sample temperature.

An embodiment of the inventive temperature control device is especially simple and reliable in which only one temperature sensor is provided. This ensures simple and robust closed-loop control of the heating power (e.g. PID controller).

In a further advantageous embodiment of the inventive temperature control device, the sensor tube is closed at the end opposite its sensor flow inlet and the temperature-control flow can escape through side openings in the wall of the sensor tube. This permits optimum setting of the ratio of RFlow by adjusting the magnitude and number of side openings. Herein, RFlow designates the ratio of the volume flow $\dot{V}out2$ of the temperature-control flow flowing into the free space between the sensor and sensor tube to the volume flow $\dot{O}n$ of the temperature-control gas flowing into the measurement space. The temperature penetration factor D depends directly on the RFlow. For that reason, it is desirable to achieve precise setting of RFlow.

An embodiment is also preferred in which the sensor tube is cylindrical and has a circular and/or oval and/or polygonal, in particular, rectangular cross-section. Non-circular cross-sections are often advantageous to utilize the space in the probe head. Moreover, these shapes may be preferred for ease of manufacturing.

In advantageous variants of this embodiment, the clearance cross-section of the sensor tube has different magnitudes at different axial positions, in particular, the cross-section in the region of the sensor flow inlet is larger than in the region of the sensor flow outlet (="nozzle tube") or vice versa (="diffusor tube"). The nozzle tube or diffusor tube permits optimum setting of the ratio RFlow for a large range of the volume flow $\dot{O}n$, depending on the flow conditions in the measurement space.

In an especially preferred embodiment, the ratio of the inside diameter $Dtube\_i$ of the sensor tube to the outside diameter $Dsens$ of the temperature sensor is: $1.02 \leq Dtube\_i/Dsens \leq 5.0$. $Dtube\_i$ and $Dsens$ denote, for non-circular cross-sections, the hydraulic diameter (dh) in each case, where $dh=4A/U$. A is the surface through which the flow passes and U is the circumference we by the fluid. In this range of $Dtube\_i/Dsens$, very good insulation is achieved due to the volume flow $\dot{V}out2$. Moreover, the space requirement of the sensor tube in the probe head is optimal for this ratio.

In a further advantageous embodiment, the sensor tube is, at least in sections, made of highly thermally insulating materials, in particular plastic, preferably Peek® or Teflon®, or of ceramics. This has the advantage that the gas flow in the sensor tube cools down less over the length of the sensor tube due to the insulating effect.

Especially favorable variants of this embodiment are characterized in that the sensor tube has an electrically conductive coating or foil acting as an RF shield. This has the advantage that radio-frequency currents cannot propagate inside the sensor tube on the RF shield of the temperature sensor. This prevents currents on the RF shield from influencing the tuning networks and the NMR coil and therefore adversely affecting the electrical parameters (quality factor, tuning response, resonance frequency of the tuning circuits) of the measuring head.

An embodiment is also advantageous in which the sensor tube, at least in sections, is made of highly thermally conductive material, in particular of metal, preferably with thin walls. Because metal can be processed very easily and is dimensionally stable, it is preferred to plastics for reasons of mechanical stability.

Alternatively or additionally, in further embodiments of the inventive temperature control device, the sensor tube in the (upper) region of the sensor flow inlet is made of highly thermally insulating material, in particular, with an electrically conductive coating or foil acting as an RF shield and, in the (lower) region of the sensor flow outlet, made of highly thermally conductive material, in particular, metal, preferably with thin walls. This configuration provides good insulation from the probe head interior in the critical upper region using a plastic having low dimensional stability and a dimensionally stable metal tube is used in the lower part. RF shielding is achieved by the continuously conductive surface of the metal tube and the conductive coating or foil connected thereto.

Embodiments of the invention are also preferred in which, for the flow ratio RFlow $\dot{V}out2/\dot{V}in$, the following applies:
RFlow=$\dot{V}out2/\dot{V}in \leq 0.5$, in particular RFlow $\leq 0.3$, preferably $0.02 \leq RFlow \leq 0.2$.

The temperature penetration factor decreases monotonically as RFlow increases. In the region RFlow >0.2, however, no further significant improvement can be achieved. For that reason, the range stated above is optimal.

Finally, in advantageous embodiments of the inventive temperature control device, the at least one temperature sensor can be a thermocouple, in particular of type K, E, T, J, N, S, R and/or a resistance thermometer, in particular PT 100, PT 1000, PTC type 201, NTC type 101 to 105, and/or a semiconductor temperature sensor, in particular with silicon or GaAlAs diodes. The inventive temperature control device can therefore be used very widely with conventional temperature sensors.

Further advantages of the invention can be derived from the description and the drawing. According to the invention, the characteristics stated above and below can, moreover, be used singly or in any combination. The embodiments shown and described are not intended to be an exhaustive list, rather are examples to describe the invention.

The invention is shown in the drawing and is explained in more detail by means of examples. The figures show:

DESCRIPTION OF THE PREFERRED EMBODIMENT

The invention relates to temperature control of NMR sample vials with minimal temperature penetration factor and simultaneous minimization of the temperature difference between the NMR sample temperature and sensor temperature.

NMR sample vials are usually operated (measured) at a defined temperature, which is set via the NMR spectrometer and is to be kept stable. It is necessary to keep the temperature constant in this way because the spectra obtained by NMR depend on the temperature of the sample substance (measurement sample). This results in changes in ambient temperature being included in the measurement result (displacement of individual frequency lines). Depending on the experiment, these effects may be unwanted and distort the image.

The invention is characterized in that at least one temperature sensor including its supply wires is located in a sensor tube. The sensor projects into the measurement space with an immersion depth ET. Typical values for ET are 0 mm to 10 mm. The sensor tube is open at both ends. At one end, it is connected to the measurement space. The temperature-control gas flow in the sensor tube (V̇out2) counteracts the longitudinal thermal conduction in the supply wire. It acts as insulation of the temperature sensor, including its supply wires, from the outside temperature. This considerably reduces the temperature penetration factor.

The sensor tube can be chosen with a small diameter because of the insulating effect of the gas flow. This makes it possible to position the temperature measuring point near to the sample vial, which, in turn, results in a small difference (ΔTp) between Tprobe and Tsensor.

Figure 1:
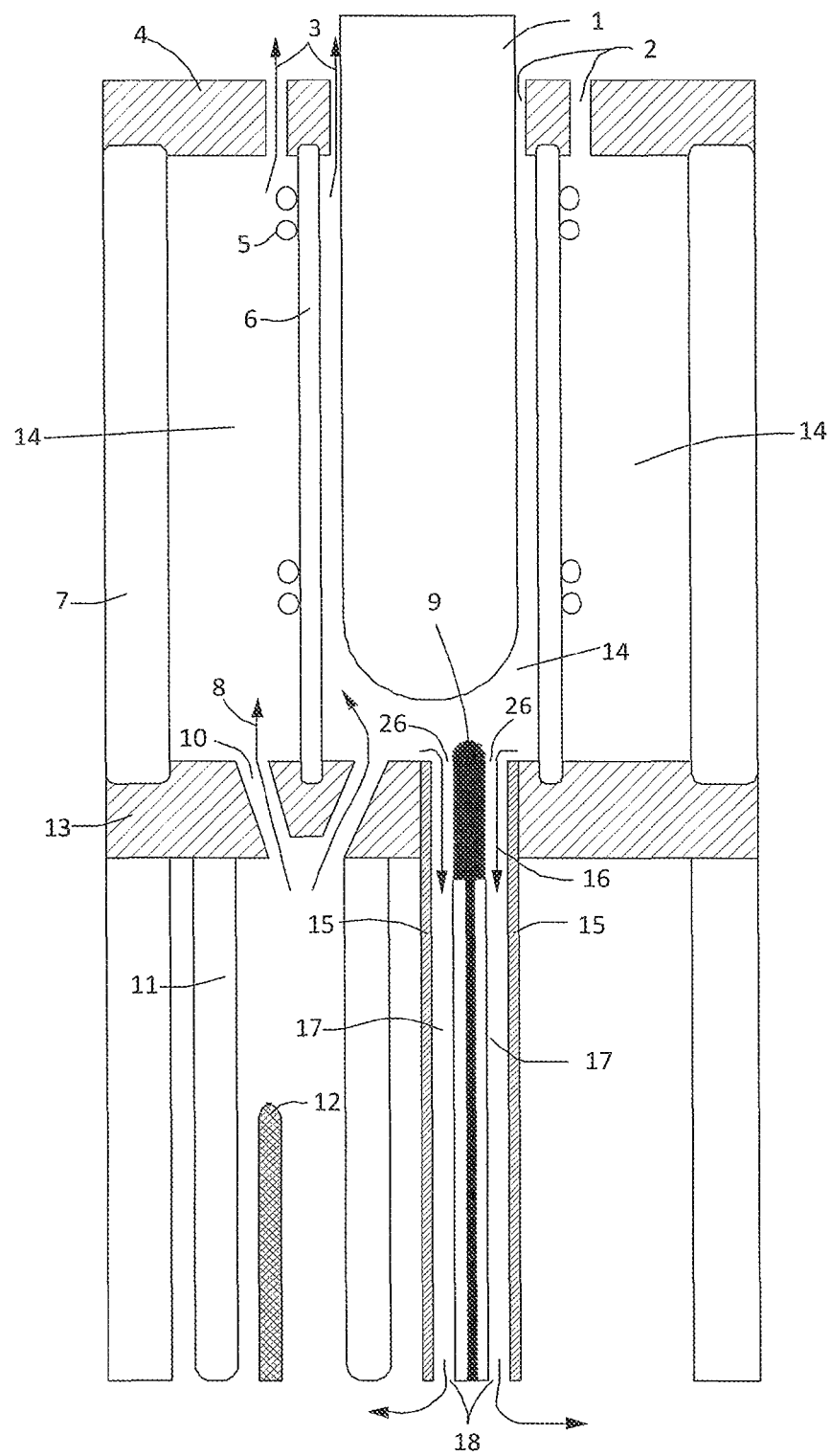
FIG. 1 an embodiment of the inventive NMR measuring device shown schematically in vertical section.

FIG. 1 shows the inventive device for probe head temperature control. The volume flow V̇in in the supply flow tube 11 is heated by the heater 12. The supply flow of the temperature-control gas 8 flows through the flow outlets 10 in the insert lower part 13 into the measurement space 14, which is surrounded by the holder 7. Part of the volume flow flows along the temperature sensor 9 to the sample 1 and heats (or cools) the latter to temperature Tprobe. A further part flows along NMR coil 5, which is located on the coil glass 6. These two partial flows exit the measurement space through the flow output 2 in the insert upper part 4. They together form the outflow 1 (denoted by 3).

In the inventive device, the temperature sensor 9 is surrounded by a sensor tube 15 and the free space 17 is located between 9 and 15. A further part 16 of the gas that has flowed into the measurement space now flows along the temperature sensor 9 into the flow inlet 26 of the sensor tube. It flows in the free space between the temperature sensor and the sensor tube and exits the sensor tube at the flow outlet of the sensor tube 18.

The temperature sensor 9 measures the temperature Tsensor on the measuring head. However, because of the thermal conduction in the longitudinal direction, the temperature is not measured at one point on the measuring head but a mixed temperature comprising the temperature of the supply wires and the temperature of the measuring head is measured. The inventive device makes it possible to keep the difference between the temperature of the gas flowing around the measuring head and the temperature measured in the measuring head as small as possible. This is achieved because the temperature-control gas flowing into the free space cools down in the direction of flow due to thermal contact with the sensor tube because the sensor tube takes on the temperature in the probe head on the outer side and heat flows from the outside of the sensor tube to the inward flow of temperature-control gas. Because the measuring head of the temperature sensor is located at the entrance of the sensor tube, the temperature influence of this part of the temperature-control gas flow decreases with the distance from the measuring head. The temperature-control gas flow in the sensor tube counteracts the longitudinal thermal conduction in the supply wire. It insulates the temperature sensor, including its supply wires, from the outside temperature. This considerably reduces the temperature penetration factor.

Figure 2:
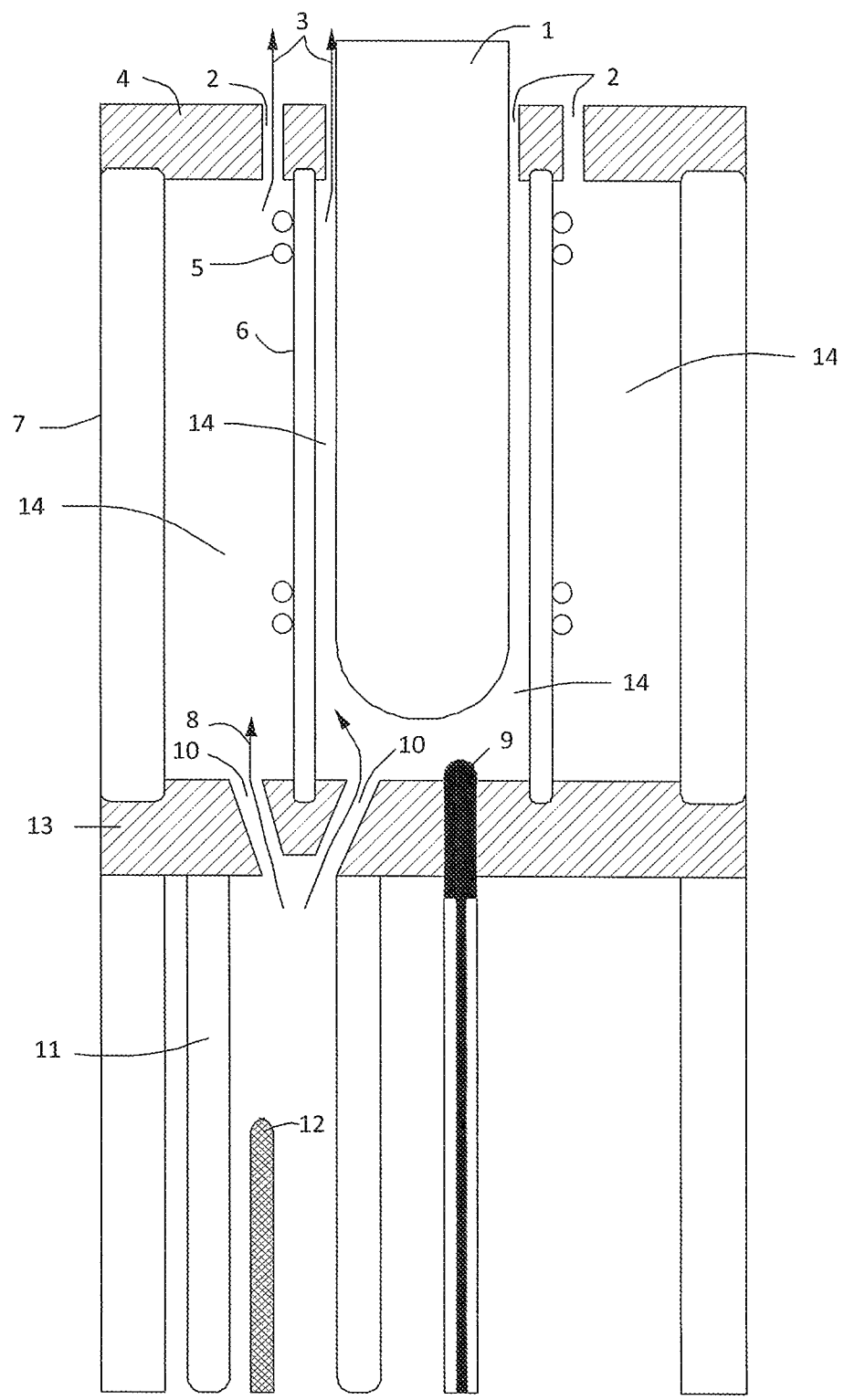
FIG. 2 a schematic vertical sectional drawing of an NMR measuring device according to prior art.

FIG. 2 shows a temperature control device according to prior art in which there is no free space between the temperature sensor and sensor tube through which part of the gas 8 flowing into the measurement space can escape.

Figure 3:
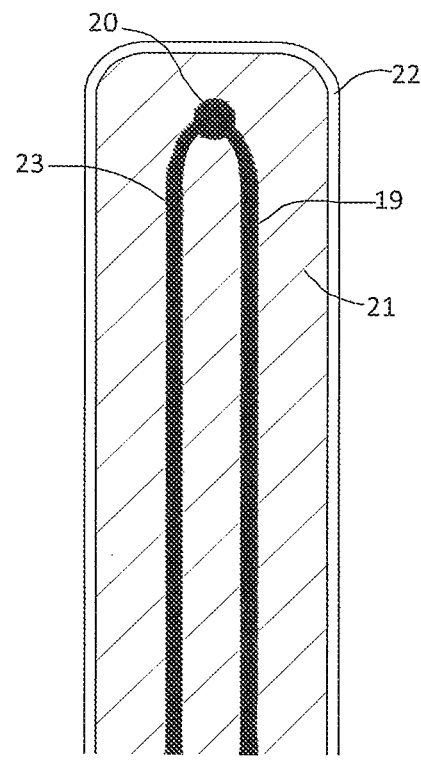
FIG. 3 a schematic vertical sectional drawing of a temperature control device according to prior art.

FIG. 3 shows a typical temperature sensor according to prior art. It consists of a supply wire of material 1 (reference 19) and a supply wire of material 2 (reference 23). They are connected at the thermojunction 20. These wires are surrounded by electrically insulating filler material 21 which is, in turn, surrounded by the RF shield.

Figure 4:
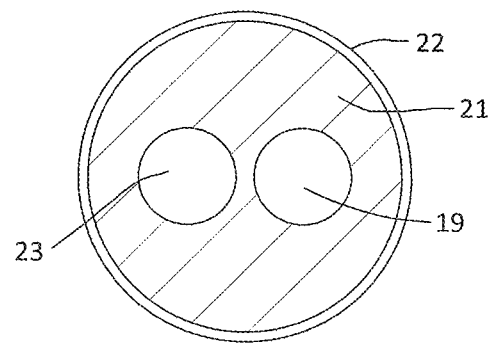
FIG. 4 a schematic horizontal section through the temperature control device according to prior art from FIG. 3.

FIG. 4 shows the temperature sensor of FIG. 3 in cross-section, below the thermojunction.

Figure 5:
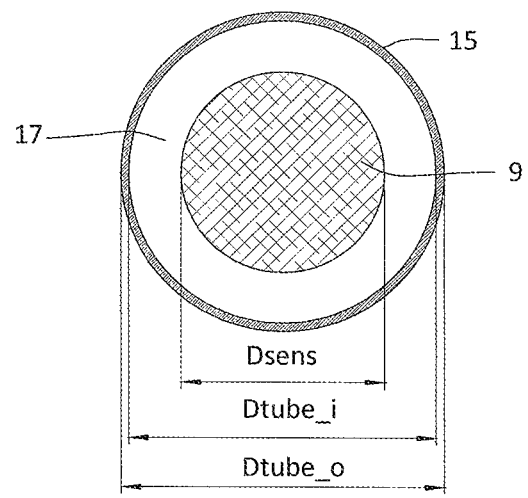
FIG. 5 a schematic, axial sectional drawing of an inventive temperature control device, with a temperature sensor, sensor tube, and free space.

In the inventive configuration, the temperature sensor 9 is surrounded by sensor tube 15. FIG. 5 shows this configuration in cross-section. The sensor tube and the sensor each have preferably a round, polygonal, or oval cross-section. A mixture of different cross-sections (e.g. sensor round, sensor tube oval) is possible. Typical values for the sensor diameter Dsens are 0.5 mm to 5 mm and for the inside diameter Dtube_i 0.55 to 8 mm, wherein Dsens and Dtube are defined for non-circular cross-sections as hydraulic diameters [4]. Typical lengths of the sensor tube Lsens are 10 mm to 100 mm.

The sensor tube consists either of a thermal insulator (e.g. plastic, such as Peek®, Telfon®, etc.) or of a non-magnetic, thin-walled thermal conductor (metal, such as copper, aluminium, bronze, etc.) or of an insulator provided on the outside with a conductive coating or conductive foil. A two-part sensor tube is also advantageous, in which the (upper) part of the sensor tube facing toward the inlet is made of a thermal insulator (e.g. plastic) and the (lower) part facing toward the outlet is made of a thermal conductor (metal). The insulator can be surrounded by a thin conductive coating or a conductive foil on the outside for better RF shielding. The configuration has the advantage that the upper part provides good thermal insulation. If the coating or foil is connected to the metal tube in a manner that is highly conductive for radio-frequency signals, this also largely prevents radio-frequency currents from being propagated on the RF shield of the temperature sensor. To further limit the region in which radio-frequency currents can propagate on the RF shield, the RF shield can be electrically conductively connected to the metal sensor tube and the sensor tube can also be electrically highly conductively connected to the ground of the measuring head. This prevents radio-frequency currents from propagating over the entire length of the RF shield. This is undesirable as currents on the RF shield can influence the tuning networks and the NMR coil and therefore adversely affect the electrical parameters (quality factor, tuning response, resonance frequency of the tuning circuits) of the measuring head.

A free space is located between the temperature sensor and sensor tube and is constructed so that part of the temperature-control gas from the measurement space can flow through this free space. In this free space, the flow cross-section is defined as a surface of the free space perpendicular to the direction of flow. The flow cross-section does not have to be constant over the length Lsens but its shape and size can change. For example, nozzle-shaped sensor tubes in which the cross-section of the sensor tube becomes smaller in the direction of flow or diffusor-type sensor tubes that have a sensor tube cross-section which widens in the direction of flow are possible. Sudden enlargements or reductions of the flow cross-section are also possible. The sensor tube can also be composed of multiple partial sections, wherein different materials can be used. It is possible to position multiple temperature sensors of the type described above in the measurement space. The measured values of the sensors are then processed with an appropriate closed-loop control algorithm.

Figure 6:
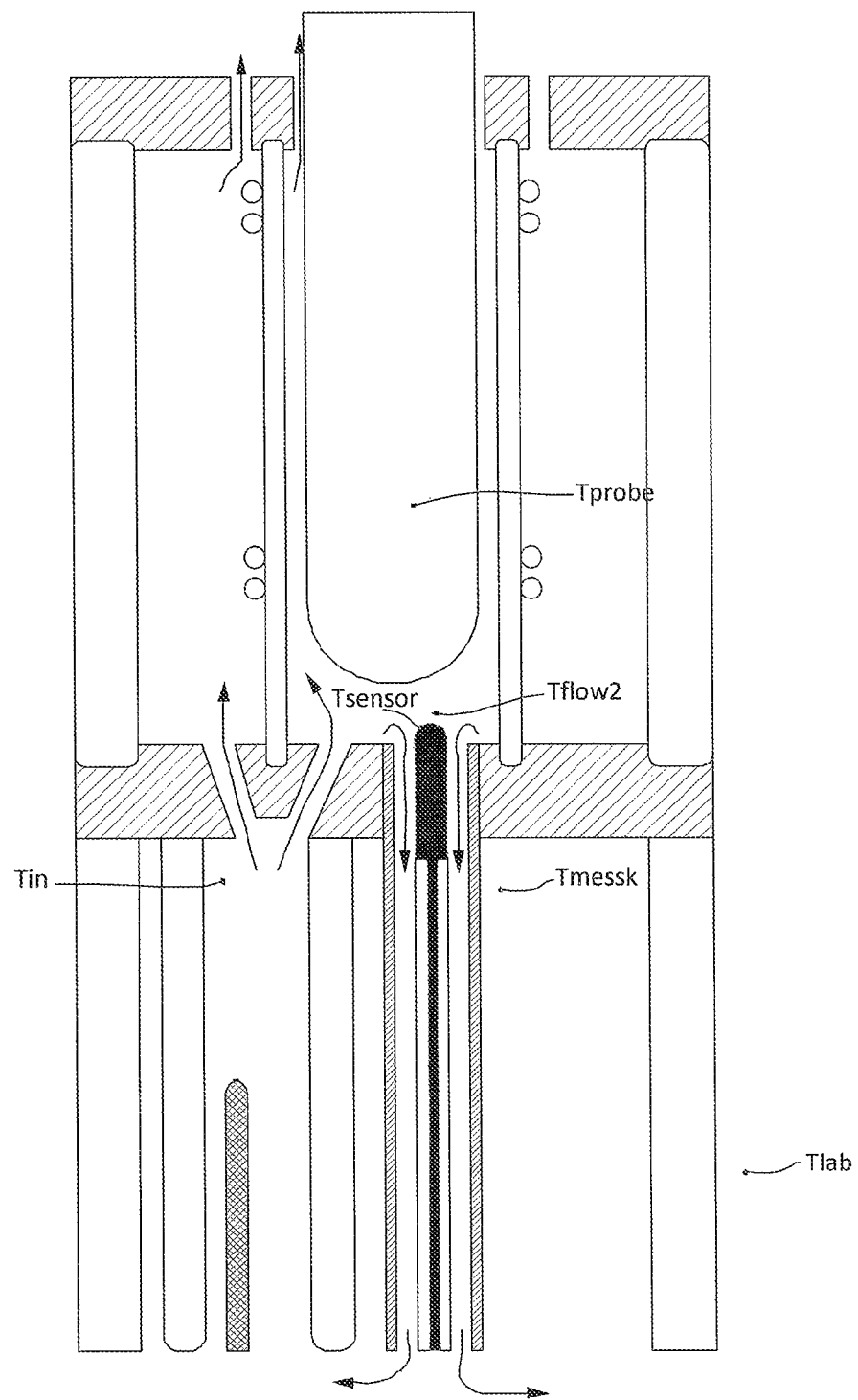
FIG. 6 the embodiment according to FIG. 1 with schematically drawn temperatures.

FIG. 6 shows the designations for the temperatures of the inventive configuration. The temperature control device is part of an NMR device that is located in the laboratory with the laboratory temperature Tlab.

The temperature Tmessk prevails inside the probe head. This is different from the temperature of the gas Tin flowing into the measurement chamber. The gas flowing around the sensor has the temperature Tflow2 and the measuring head of the sensor takes on the temperature Tsensor. Tsensor is used as the input variable for closed-loop control of the heating power. The temperature Tprobe occurs in the sample.

Figure 7:
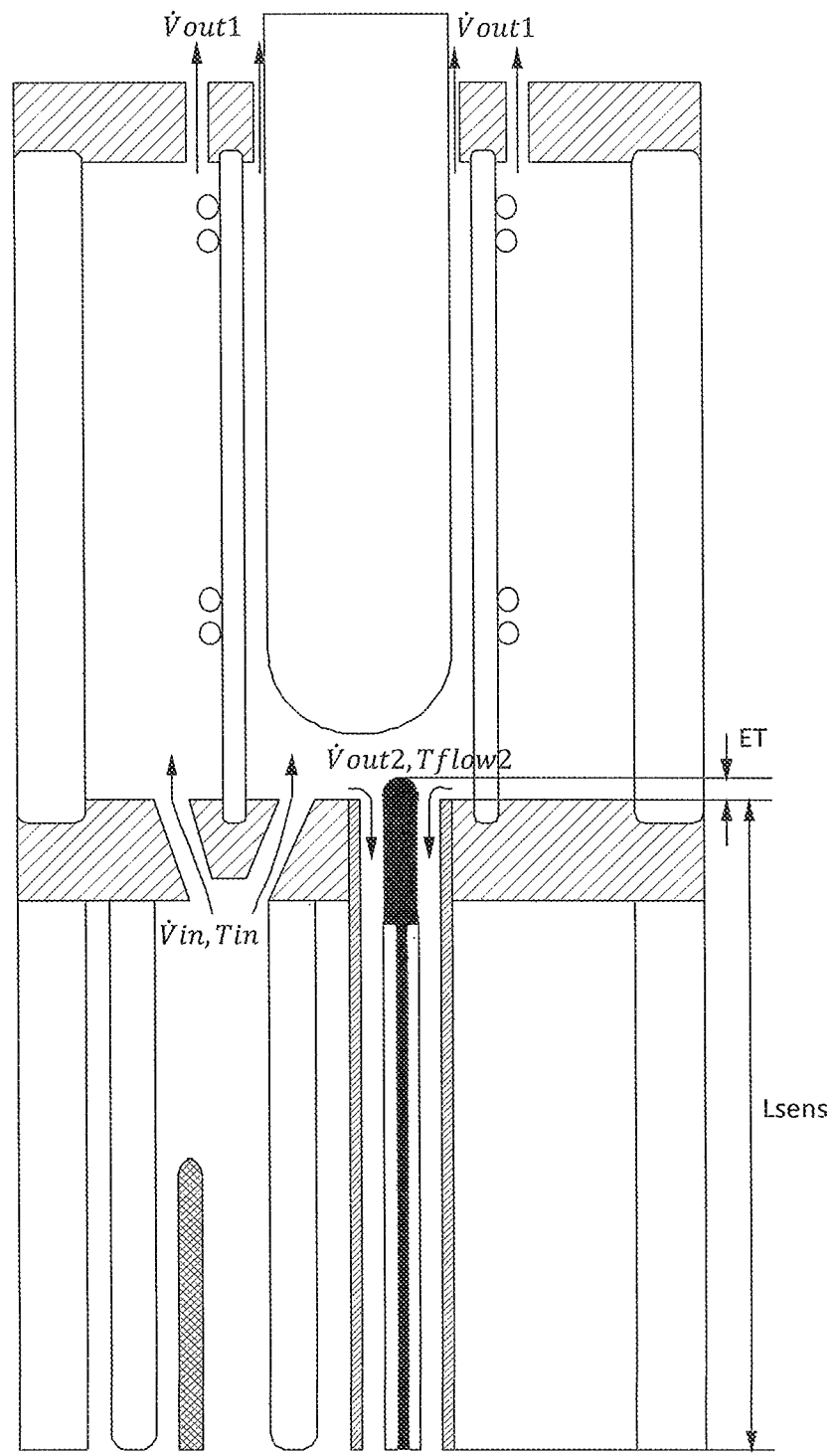
FIG. 7 the embodiment according to FIG. 1 with schematically drawn volume flows.

FIG. 7 shows the volume flow. The volume flow $\dot{V}$in flowing into the measurement space splits into the volume flow $\dot{V}$out1 flowing out of the flow outlet and the volume flow $\dot{V}$out2 flowing through the free space 17. The temperature sensor projects into the measurement space by the length ET and is located in the sensor tube having length Lsens.

Figure 8:
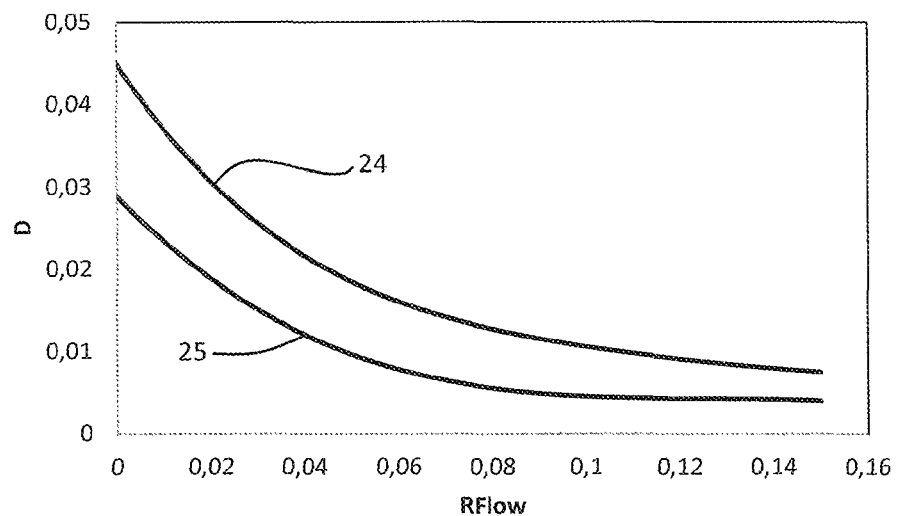
FIG. 8 the dependence of the temperature penetration factor D as a function of RFlow for immersion depths ET=1.5 mm, curve 24, and ET=3 mm, curve 25.

FIG. 8 shows the temperature penetration factor D as a function of the volume flow ratio RFlow of inflowing gas $\dot{V}$in and gas $\dot{V}$out2 flowing through the sensor tube for a typical NMR probe head, that is $$RFlow = \dot{V}out2/\dot{V}in$$

Herein, the case RFlow=0 corresponds to prior art. The cases in which RFlow >0 are achieved by the inventive configuration. With a proportion of 6% to 15% volume flowing through the sensor tube to inflowing volume, a considerable reduction of the temperature penetration factor is achieved. The ratio RFlow depends on the parameters listed below and can be set accordingly.

The flow ratio RFlow depends on the flow cross-section in the free space 17, which is formed by the sensor and by the sensor tube. The larger the flow cross-section in the free space, the larger RFlow will be (if all other parameters remain unchanged).

Moreover, RFlow depends on the length of the sensor tube. The longer the sensor tube for a given flow cross-section, the smaller RFlow will be (because of the friction on the inner wall of the sensor tube and the outer enclosure of the temperature sensor).

Figure 9:
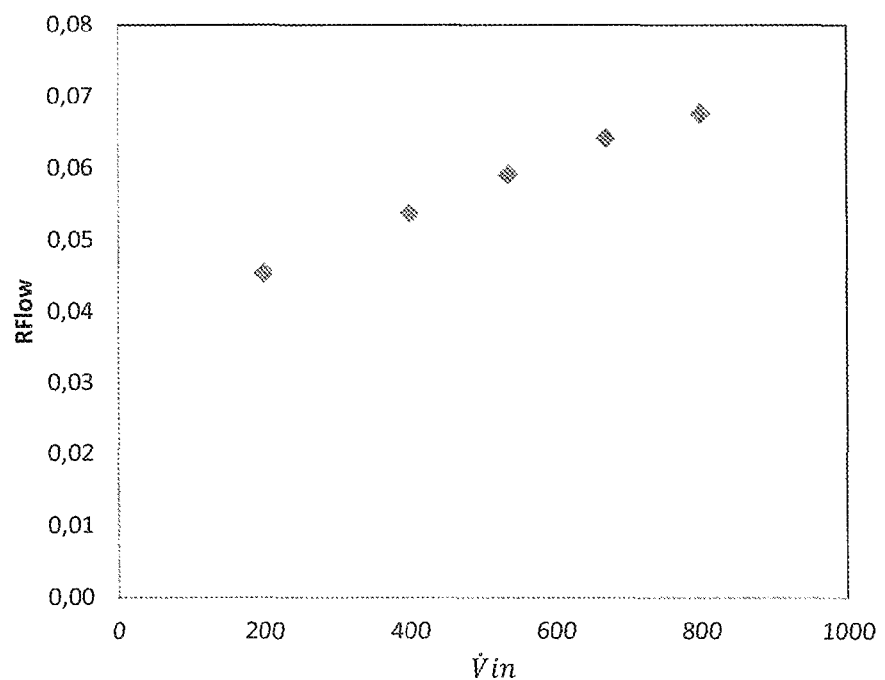
FIG. 9 RFlow as a function of the volume flow On entering the measurement space.

Furthermore, RFlow depends on the volume flow of the inflowing temperature-control gas ($\dot{V}$in), i.e. RFlow increases approximately linearly with $\dot{V}$in. As is shown in FIG. 9, $\dot{V}$in typically varies in the range 0 liters per hour (l/h) to 2000 l/h.

REFERENCE LIST

[1] L. F. Hlavaka, U.S. Pat. No. 4,266,194
[2] B. Grossniklaus, F. Raffa, M. Mayer, D. Wilhelm, DE 10 2010 029 080 A1
[3] P. B. Hepp, W. H. Tschopp, M. Rindlisbacher, O. Schett, DE 40 18 734 C2
[4] W. Wagner, Strömungstechnik and Druckverlustberechnung, 1990, Vogel-Fachbücher, Würzburg
[5] O. K. Fiedler, H.-D. Drees, DE 40 17 079 A1
[6] D. Marek, DE 10006317 C1

We claim:

1. An NMR measuring system for analysis of a solid and/or liquid sample substance disposed within an NMR sample vial, the NMR measuring system comprising:
   an NMR spectrometer, said NMR spectrometer having structure defining a measurement space, wherein said structure defining said measurement space is adapted to accept the NMR sample vial and to hold the sample vial at a measuring position, said NMR spectrometer also having NMR coils surrounding said measuring position and temperature-control fluid components structured to direct a temperature-control fluid to flow around the sample vial at said measuring position, said NMR spectrometer further comprising a temperature control device,
wherein said temperature control device comprises:
   a controlled heater, said controlled heater communicating with the temperature-control fluid in a supply flow to said measuring position;
   at least one temperature sensor having a temperature-sensitive measuring head positioned in a spatial vicinity of said measuring position and at least partially projecting into said measurement space, wherein said temperature sensor has supply wires to said measuring head which are disposed in a space that is separate from said measurement space; and
   a sensor tube, said sensor tube surrounding said temperature sensor and said supply wires at a radial distance, wherein said sensor tube communicates with said measurement space via a sensor flow inlet and is structured to direct a partial flow of the temperature-control fluid to flow as a temperature-control flow out of said measurement space into a free space between said temperature sensor and an inner wall of said sensor tube to pass along said supply wires and flow out of said sensor tube via a sensor flow outlet at an end of said sensor tube opposite said sensor flow inlet or through side openings in a wall of said sensor tube, said sensor tube being cylindrical and having a circular, oval, polygonal or rectangular cross-section, wherein a clearance cross-section of said sensor tube has different magnitudes at different axial positions of said sensor tube.

2. The NMR measuring system of claim 1, wherein said sensor tube is a nozzle tube, said clearance cross-section in a region of said sensor flow inlet being larger than in a region of said sensor flow outlet.

3. The NMR measuring system of claim 1, wherein said sensor tube is a diffusor tube, said clearance cross-section in a region of said senor flow inlet being smaller than in a region of said sensor flow outlet.

4. An NMR measuring system for analysis of a solid and sample subsubstance disposed within an NMR sample vial, the NMR measuring system comprising:
an NMR spectrometer, said NMR spectrometer having structure defining a measurement space, wherein said structure defining said measurement space is adapted to accept the NMR sample vial and to hold the sample vial at a measuring position, said NMR spectrometer also having NMR coils surrounding said measuring position and temperature-control fluid components structured to direct a temperature-control fluid to flow around the sample vial at said measuring position, said NMR spectrometer further comprising a temperature control device,
wherein said temperature control device comprises:
a controlled heater, said controlled heater communicating with the temperature-control fluid in a supply flow to said measuring position;
at least one temperature sensor having a temperature-sensitive measuring head positioned in a spatial vicinity of said measuring position and at least partially projecting into said measurement space, wherein said temperature sensor has supply wires to said measuring head which are disposed in a space that is separate from said measurement space; and
a sensor tube, said sensor tube surrounding said temperature sensor and said supply wires at a radial distance, wherein said sensor tube communicates with said measurement space via a sensor flow inlet and is structured to direct a partial flow of the temperature-control fluid to flow as a temperature-control flow out of said measurement space into a free space between said temperature sensor and an inner wall of said sensor tube to pass along said supply wires and flow out of said sensor tube via a sensor flow outlet at an end of said sensor tube opposite said sensor flow inlet or through side openings in a wall of said sensor tube, wherein $1.02 \leq Dtube\_i/Dsens \leq 5.0$, with $Dtube\_i$ being an inside diameter of said sensor tube and $Dsens$ an outside diameter of said temperature sensor, wherein, for non-circular cross-sections, $Dtube\_i$ and $Dsens$ each denote hydraulic diameters $dh=4A/U$, with $A$ denoting a surface through which the flow passes and $U$ denoting a circumference wet by the temperature-control fluid.

5. The NMR measuring system of claim 4, wherein said heater is disposed upstream of a flow inlet to the measurement space, wherein said flow inlet is structured to pass the supply flow of the temperature-control fluid into said measurement space.

6. The NMR measuring system of claim 4, wherein only one temperature sensor is provided.

7. The NMR measuring system of claim 4, wherein at least sections of said sensor tube are made of thermally insulating materials, of plastic, of Polyetheretherketone, of Polytetrafluoroethylene or of ceramics.

8. The NMR measuring system of claim 4, wherein at least sections of said sensor tube are made of thermally conductive material, of metal or have walls having a thickness which is substantially less than a diameter of said sensor tube.

9. The NMR measuring system of claim 4, wherein, in a region of sensor flow inlet, said sensor tube is made of thermally insulating material or has an electrically conductive coating or foil configured as an RF shield, wherein, in a region of sensor flow outlet, said sensor tube comprises a thermally conductive material, metal or has walls having a thickness which is substantially less than a diameter of said sensor tube.

10. The NMR measuring system of claim 4, wherein said at least one temperature sensor comprises a thermocouple, a thermocouple of type K, E, T, J, N, S, R, and/or a resistance thermometer or a PT 100, PT 1000, PTC type 201, NTC type 101 to 105 and/or a semiconductor temperature sensor or a thermocouple sensor with silicon or GaAlAs diodes.

11. An NMR measuring system for analysis of a solid and/or liquid sample substance disposed within an NMR sample vial, the NMR measuring system comprising:
an NMR spectrometer, said NMR spectrometer having structure defining a measurement space, wherein said structure defining said measurement space is adapted to accept the NMR sample vial and to hold the sample vial at a measuring position, said NMR spectrometer also having NMR coils surrounding said measuring position and temperature-control fluid components structured to direct a temperature-control fluid to flow around the sample vial at said measuring position, said NMR spectrometer further comprising a temperature control device,
wherein said temperature control device comprises:
a controlled heater, said controlled heater communicating with the temperature-control fluid in a supply flow to said measuring position;
at least one temperature sensor having a temperature-sensitive measuring head positioned in a spatial vicinity of said measuring position and at least partially projecting into said measurement space, wherein said temperature sensor has supply wires to said measuring head which are disposed in a space that is separate from said measurement space; and
a sensor tube, said sensor tube surrounding said temperature sensor and said supply wires at a radial distance, wherein said sensor tube communicates with said measurement space via a sensor flow inlet and is structured to direct a partial flow of the temperature-control fluid to flow as a temperature-control flow out of said measurement space into a free space between said temperature sensor and an inner wall of said sensor tube to pass along said supply wires and flow out of said sensor tube via a sensor flow outlet at an end of said sensor tube opposite said sensor flow inlet or through side openings in a wall of said sensor tube, wherein for a flow component RFlow, defined by a ratio of volume flow $\dot{V}out2$ of temperature-control flow flowing into said free space to a volume flow $\dot{V}$ in of the temperature-control fluid flowing into the measurement space, the following applies: $RFlow=\dot{V}out2/\dot{V}$ in $\leq 0.5$, $RFlow \leq 0.3$ or $0.02 \leq RFlow \leq 0.2$.

12. The NMR measuring system of claim 11, wherein said at least one temperature sensor comprises a thermocouple, a thermocouple of type K, E, T, J, N, S, R, and/or a resistance thermometer or a PT 100, PT 1000, PTC type 201, NTC type 101 to 105 and/or a semiconductor temperature sensor or a thermocouple sensor with silicon or GaAlAs diodes.

13. The NMR measuring system of claim 11, wherein said heater is disposed upstream of a flow inlet to the measurement space, wherein said flow inlet is structured to pass the supply flow of the temperature-control fluid into said measurement space.

14. The NMR measuring system of claim 13, wherein said heater is disposed in a supply flow tube.

15. The NMR measuring system of claim 13, wherein the measurement space is enclosed between an insert lower part and an insert upper part spaced from said insert lower part in an axial direction of the NMR sample vial by a holder, wherein a flow inlet for the supply flow of the temperature-control fluid into the measurement space is provided in said insert lower part and a flow outlet for outflow of temperature-control fluid out of the measurement space is provided in said insert upper part or in said insert lower part.

16. The NMR measuring system of claim 15, wherein said temperature-sensitive measuring head of said temperature sensor projects into the measurement space over and above an upper edge of said insert lower part by an immersion depth ET ≤20mm.

17. The NMR measuring system of claim 11, wherein only one temperature sensor is provided.

18. The NMR measuring system of claim 11, wherein at least sections of said sensor tube are made of thermally insulating materials, of plastic, of Polyetheretherketone, of Polytetrafluoroethylene or of ceramics.

19. The NMR measuring system of claim 18, wherein said sensor tube has an electrically conductive coating or foil configured as an RF shield.

20. The NMR measuring system of claim 11, wherein at least sections of said sensor tube are made of thermally conductive material, of metal or have walls having a thickness which is substantially less than a diameter of said sensor tube.

21. The NMR measuring system of claim 11, wherein, in a region of sensor flow inlet, said sensor tube is made of thermally insulating material or has an electrically conductive coating or foil configured as an RF shield, wherein, in a region of sensor flow outlet, said sensor tube comprises a thermally conductive material, metal or has walls having a thickness which is substantially less than to a diameter of said sensor tube.

\* \* \* \* \*